United States Patent
Bu et al.

(10) Patent No.: US 6,806,149 B2
(45) Date of Patent: Oct. 19, 2004

(54) SIDEWALL PROCESSES USING ALKYLSILANE PRECURSORS FOR MOS TRANSISTOR FABRICATION

(75) Inventors: Haowen Bu, Plano, TX (US); Malcolm J. Bevan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 10/255,215

(22) Filed: Sep. 26, 2002

(65) Prior Publication Data

US 2004/0063260 A1 Apr. 1, 2004

(51) Int. Cl.$^7$ .............................................. H01L 21/336
(52) U.S. Cl. ...................... 438/299; 438/301; 438/305
(58) Field of Search ............................... 438/197, 299, 438/301, 303, 305, 306, 307

(56) References Cited

U.S. PATENT DOCUMENTS

| | | | | |
|---|---|---|---|---|
| 5,989,966 A | * | 11/1999 | Huang | 438/305 |
| 6,153,483 A | * | 11/2000 | Yeh et al. | 438/299 |
| 6,406,945 B1 | * | 6/2002 | Lee et al. | 438/142 |
| 6,429,062 B1 | * | 8/2002 | Rubin | 438/199 |
| 6,461,923 B1 | * | 10/2002 | Hui et al. | 438/305 |

* cited by examiner

Primary Examiner—Kamand Cuneo
Assistant Examiner—Scott B. Geyer
(74) Attorney, Agent, or Firm—Peter K. McLarty; W. James Brady, III; Frederick J. Telecky, Jr.

(57) ABSTRACT

A method for using alkylsilane precursors during the sidewall formation process in MOS transistor fabrication processes. Alkylsilane precursors are used to form carbon contain silicon oxide layers (110) and carbon containing silicon nitride layers (120) during the sidewall formation process. The carbon containing layers (110) (120) introduce carbon into the extension regions (100) and the gate region (30) during thermal annealing.

10 Claims, 3 Drawing Sheets

SIDEWALL PROCESSES USING ALKYLSILANE PRECURSORS FOR MOS TRANSISTOR FABRICATION

FIELD OF THE INVENTION

The invention is generally related to the field of MOSFET transistors and more specifically to a novel process to achieve a high active doping concentration and reduce the junction depth of the source and drain extension regions.

BACKGROUND OF THE INVENTION

Shown in FIG. 1 is a cross-sectional diagram of a typical metal oxide semiconductor (MOS) transistor 5. The MOS transistor 5 is fabricated in a semiconductor substrate 10. The MOS transistor comprises a gate dielectric layer 20 that is formed on the surface of the substrate 10. Typically this gate dielectric layer is formed using silicon oxide or nitrided silicon oxide although many other materials such as silicates have been used. The MOS transistor gate structure 30 is formed on the gate dielectric layer 20 and is typically formed using polycrystalline silicon. In addition to polycrystalline silicon other materials such as metals have been used to form the transistor gate. The combined dielectric layer/gate structure is often referred to as the gate stack. Following the formation of the transistor gate stack the source-drain extension regions 40 are formed using ion implantation. In forming these extension regions 40 dopants are implanted into the substrate using the gate stack as a mask. Therefore the extension regions 40 are aligned to the gate stack in what is known as the self-aligned process. Following the formation of the extension regions 40, sidewall structures 50 are formed adjacent to the gate stack. These sidewall structures 50 are typically formed by depositing one or more conformal films on the surface of the substrate followed by an anisotropic etch process. This anisotropic etch will remove the conformal film[s] from all regions of the surface except those adjacent to gate stack structures. This results in the sidewall structures 50 shown in FIG. 1. Following the formation of the sidewall structures the source and drain regions 60 are formed using ion implantation. The structure is then annealed at high temperature to activate the implanted dopant species in both the extension regions 40 and the source and drain regions 60. During this high temperature anneal the dopants will diffuse into the semiconductor substrate. This dopant diffusion will result in a final junction depth of $x_j$ for the extension regions 40.

As MOS transistor dimensions are reduced there is a need to achieve high dopant activation in the extension region 40 and simultaneously reduce the junction depth $x_j$ of the regions. Typically this is accomplished by trying to optimize the implantation dose and energy of the dopant species used to form the extension regions 40. A reduction in $X_j$ often leads to an increase in the drain and source resistance of the MOS transistor resulting in a degrading of the MOS transistor performance. There is therefore a need to reduce the extension junction depth $x_j$ without sacrificing the active dopant concentration.

SUMMARY OF THE INVENTION

The instant invention describes a method for forming a MOS transistor using alkylsilane precursors during the sidewall formation process. In particular a gate stack is formed on a semiconductor substrate. In some embodiments an offset spacer structure is formed adjacent to said gate stack before forming extension regions in said semiconductor substrate adjacent to said gate stack. A carbon containing silicon oxide layer is then formed over the gate stack and the extension regions using alkylsilane precursors. Sidewall structures are then formed adjacent to said carbon containing silicon oxide layer on opposite sides of said gate stack. Source and drain regions are then formed in said semiconductor substrate adjacent to said sidewall structures and the entire structure is then thermally annealed.

Technical advantages of the instant invention include a reduction in transient enhanced diffusion, increased dopant activation, and a reduction in gate edge dopant depletion. Other technical advantages will be readily apparent to one skilled in the art from the following figures, description, and claims.

Figure 1:
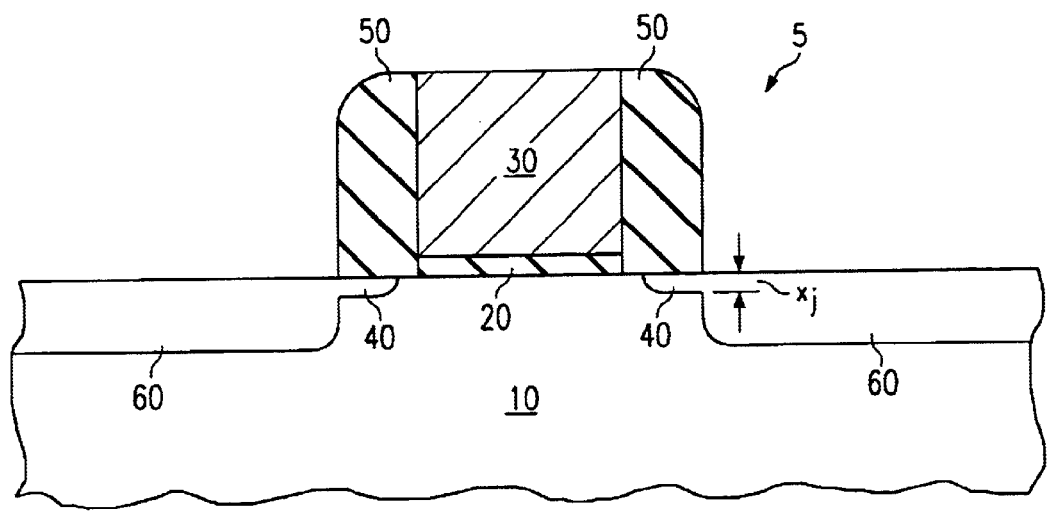
FIG. 1 is a cross-sectional diagram of a MOS transistor.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 2(a)–2(d) and FIG. 3, the instant invention can be utilized in any semiconductor device structure. For example the instant invention can be used in forming the source drain regions prior to forming the source and drain extension regions. This process is often called a disposable sidewall process. The methodology of the instant invention provides a solution to obtaining ultra-shallow extension regions with enhanced active dopant concentration for improved CMOS transistor performance.

Figure 2A:
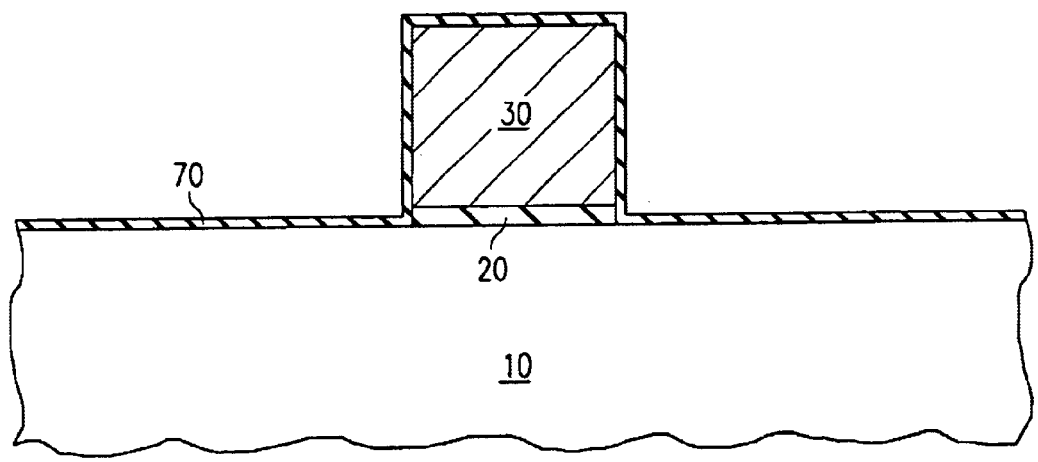
FIGS. 2(a)–2(d) are cross-sectional diagrams illustrating the formation of a MOS transistor at various steps in an embodiment of the instant invention.
Figure 2B:
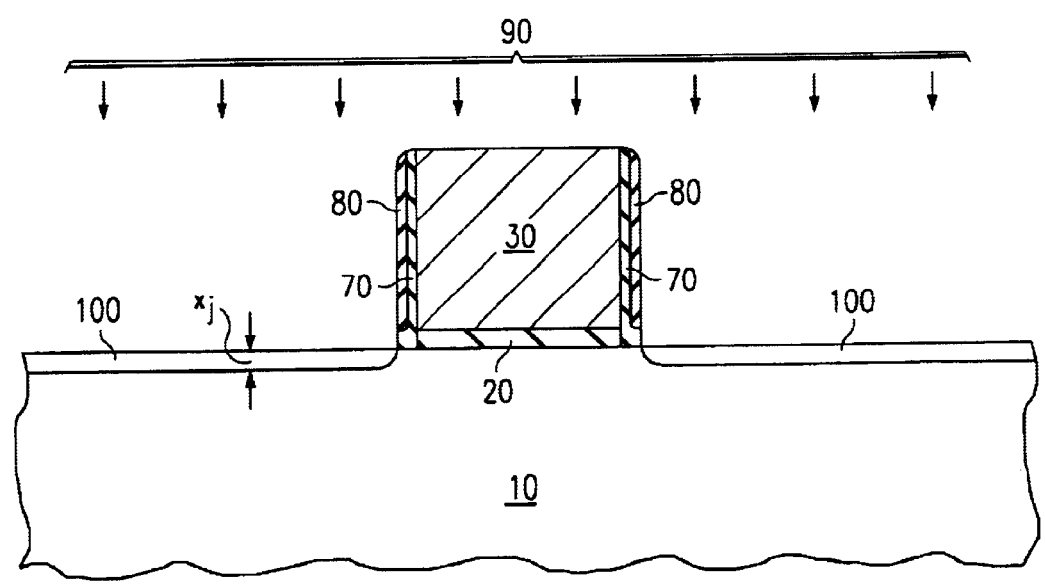
Figure 2C:
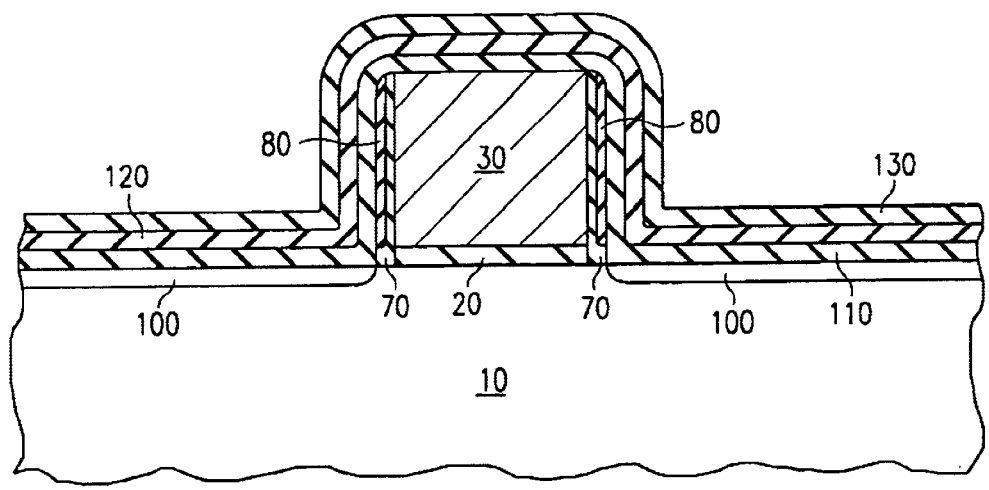
Figure 2D:
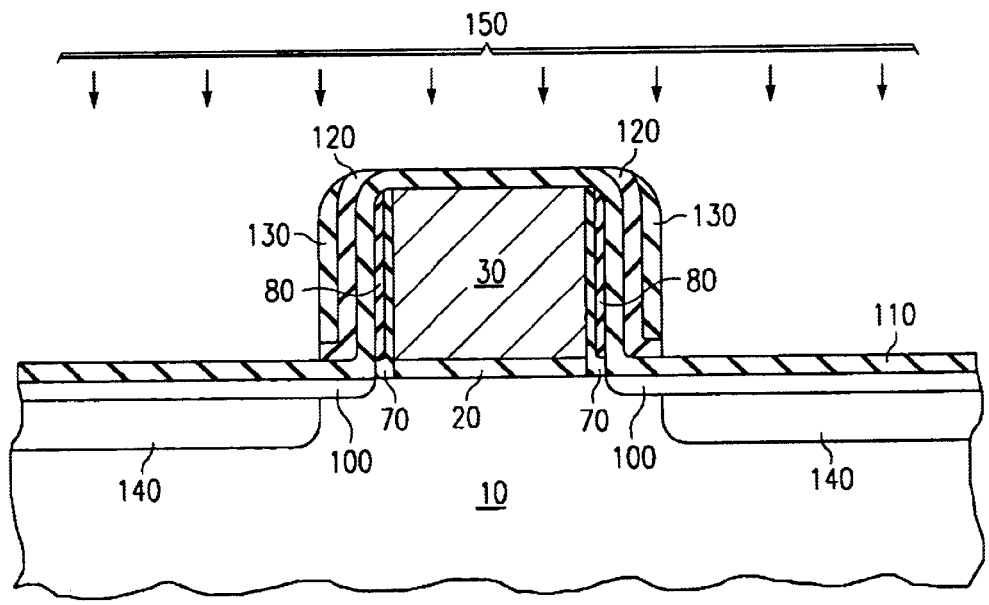

As shown in FIG. 2(a) the MOS transistors of the instant inventions are fabricated on a semiconductor substrate 10. In an embodiment of the instant invention the substrate 10 is a silicon substrate with or without an epitaxial layer. The MOS transistors of the instant invention can also be formed on silicon-on-insulator substrates that contain a buried insulator layer. The MOS transistors are fabricated in n-type or p-type well regions that are formed in the substrate 10. These n-type or p-type well regions have been omitted from the Figures for clarity.

In forming the MOS transistors of the instant invention, a gate dielectric region 20 is formed on the substrate 10. The gate dielectric region 20 can be formed using silicon oxide, silicon oxynitride, alternating layers of silicon oxide and silicon nitride, or any suitable dielectric material. Following the formation of the gate dielectric layer 20, a blanket layer of polycrystalline silicon, a metal, or any suitable material is formed on the gate dielectric layer 20. Photolithography and dry etching techniques are then used to pattern and etch the blanket layer to form the transistor gate 30. The dielectric layer 20 and gate 30 will be referred to as the gate stack. Following the formation of a gate stack where polycrystalline silicon is used to form the transistor gate 30, an oxidation process or a chemical vapor deposition (CVD) process is performed to grow or deposit the layer of silicon oxide 70 shown in FIG. 2 (*a*). In an embodiment of the instant invention the silicon oxide layer 70 will be between 10 and 70 Å thick.

Following the formation of the silicon oxide layer 70, optional offset spacer structures 80 are formed as shown in FIG. 2(*b*). In an embodiment of the instant invention the offset spacer structures 80 are formed by first depositing a conformal layer of silicon nitride over the silicon oxide layer 70. An anisotropic dry etch process is then used to remove certain regions of the silicon nitride layer resulting in the sidewall spacer structures 80. Source-drain extension (extension) regions 100 are then formed in the substrate 10 by the ion implantation of various dopant species 90. The as implanted extension regions 100 (i.e. prior to any high temperature thermal annealing) will be aligned to the edge of the sidewall spacer structures 80. Following the formation of the extension regions 100 an optional thermal anneal can be performed. For PMOS transistors the implantation process can comprise a single or multiple implantation steps using p-type dopants such as boron and $BF_2$. In addition other implants such as those used to form the pocket regions can also be performed at this time. For NMOS transistors the implantation process can comprise a single or multiple implantation steps using n-type dopants such as arsenic and phosphorous. Other implants such as those used to form the pocket regions can also be performed at this time. It is extremely important to simultaneously achieve high dopant activation levels and shallow junction depths $X_j$ in the extension regions 100. To achieve these shallow junction depths with high active dopant concentrations, a high dose of the implanted dopant should be placed close to the surface of the substrate 10 to allow for dopant diffusion during the subsequent high temperature rapid thermal anneal. The increase of the as implanted extension junction depth during the high anneal is reduced while the active dopant concentration is increased using the methodology of the instant invention.

Following the formation of the extension regions 100 a number of contiguous layers are formed on the structure of FIG. 2(*b*). This is illustrated in FIG. 2(*c*) where the formation of three contiguous layers 110, 120, and 130 is shown. In an embodiment of the instant invention the first layer 110 is a carbon containing silicon oxide layer (C—$SiO_2$). The C—$SiO_2$ layer 110 is formed using a chemical vapor deposition (CVD) process comprising silane($SiH_4$) or disilane ($Si_2H_6$), an alkylsilane ($C_nH_{(2n+1)}$—$SiH_3$), and nitrous oxide ($N_2O$). The alkylsilane can comprise methylsilane ($CH_3SiH_3$), ethyl silane ($C_2H_5$—$SiH_3$), or propylsilane ($C_3H_7$—$SiH_3$). In a particular CVD process 20 to 50 sccm of an alkylsilane gas is diluted in approximately 1000 sccm of nitrogen or hydrogen. This diluted alkysilane (dil-alkysilane) gas is then combined with silane and nitrous oxide in a process chamber in the ratios 5–40 sccm of dil-alkylsilane, 2–20 sccm of silane, and 1000–5000 sccm of nitrous oxide at temperatures of 550° C. to 800° C. The C—$SiO_2$ layer can be deposited using a single wafer rapid thermal process chamber or a conventional batch furnace, although a single wafer process is preferred because of the lower thermal budget. The single wafer process can be done in a heater based or a rapid thermal process (RTP) chamber. Varying the flow ratio of the alkysilane to silane and nitrous oxide can vary the carbon concentration in the first layer 110. In a further embodiment of the instant invention the first layer 110 comprises a silicon oxide layer.

In an embodiment of the instant invention the second layer 120 comprises carbon containing silicon nitride (C—SiN). The C—SiN layer 120 is formed using a chemical vapor deposition (CVD) process comprising silane($SiH_4$) or disilane ($Si_2H_6$), an alkylsilane ($C_nH_{(2n+1)}$—$SiH_3$), and ammonia($NH_3$). In addition to silane and disaline, other silicon containing gases such as dichlorosilane ($SiH_2Cl_2$) or hexachlorosilane ($Si_2Cl_6$) can be used for the silicon source gas. The alkylsilane can comprise methylsilane ($CH_3$—$SiH_3$), ethyl silane ($C_2H_5$—$SiH_3$), or propylsilane ($C_3H_7$—$SiH_3$). In a particular CVD process 20 to 50 sccm of an alkylsilane gas is diluted in approximately 1000 sccm of nitrogen or hydrogen. This diluted alkysilane (dil-alkysilane) gas is then combined with silane and ammonia in a process chamber in the ratios 5–20 sccm of dil-alkylsilane, 5—40 sccm of silane, and 1000—5000 sccm of ammonia at temperatures of 500° C. to 800° C. The C—SiN layer can be deposited using a single wafer rapid thermal process chamber or a conventional batch furnace, although a single wafer process is preferred for its lower thermal budget. Varying the flow rate of the alkysilane gas and ammonia can vary the carbon and nitrogen concentration in the second layer 120. In a further embodiment of the instant invention the second layer 120 comprises a silicon nitride formed using a CVD bis t-ButylaminoSilane (BTBAS) process. In this process BTBAS ($SiH_2(t-BuNH)_2$) along with $NH_3$ and other gases such as nitrogen are used to deposit the silicon nitride layer 120 at temperatures between 475° C. and 650° C. Following the formation of the second layer 120, a silicon oxide layer 130 is formed. In an embodiment of the instant invention the silicon oxide layer 130 is formed using a single wafer chemical vapor deposition process at temperatures between 550° C. and 750° C.

As shown in FIG. 2(*d*) regions of the layers 120 and 130 are removed to form sidewall structures. In an embodiment of the instant invention anisotropic silicon oxide and silicon nitride etch processes are used to remove the unwanted regions of layers 120 and 130. Following the sidewall formation process the extension regions 100 are still covered by the C—$SiO_2$ layer 110 even through some of this layer might be lost during the anisotropic silicon nitride etch process.

After the sidewall formation process an optional thermal anneal can be performed. The source and drain regions 140 are then formed by implanting dopant species 150 into the substrate. For PMOS transistors the implantation process can comprise a single or multiple implantation steps using p-type dopants such as boron and/or $BF_2$. For NMOS transistors the implantation process can comprise a single or multiple implantation steps using n-type dopants such as arsenic and/or phosphorous. Following the implantation of the source drain regions 140 a high temperature anneal is performed to activate the implanted dopants. In a particular embodiment the high temperature anneal comprise a 1000° C. to 1100° C. rapid thermal anneal. During the rapid thermal anneal boron diffusion in the extension regions 100 is reduced and the activated dopant concentration at the substrate surface in the extension regions 100 is increased. Also during the rapid thermal anneal carbon diffuses into the polysilicon silicon gate 30 and the extension regions 100. This carbon incorporation will reduce transient enhanced diffusion (TED), improve dopant activation, and reduce gate edge dopant depletion.

Figure 3:
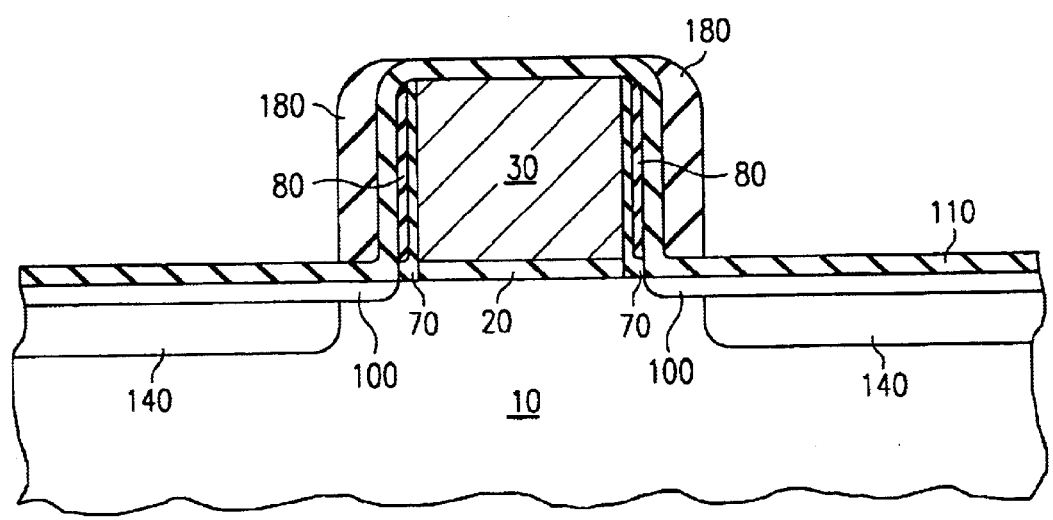
FIG. 3 is a cross section diagram illustrating a further embodiment of the instant invention.

Shown in FIG. 3 is a further embodiment of the instant invention. In this embodiment the C—$SiO_2$ layer 110 is formed as described above with a CVD process comprising $SiH_4$, $N_2O$, and alkylsilane. Following the formation of the C—$SiO_2$ layer 110, a single silicon nitride layer is formed. This layer can be formed using the alkylsilane or BTBAS processes described above or any other suitable technique.

The silicon nitride layer is then etched to form the silicon nitride sidewall structure 180 shown in FIG. 3. The source and drain regions 140 are then formed as described above. Following the formation of the source and drain regions 140 the implanted regions are annealed as described above.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for fabricating a MOS transistor, comprising:

providing a semiconductor substrate;

forming a gate stack on said semiconductor substrate;

forming extension regions in said semiconductor substrate adjacent to said gate stack;

forming a carbon containing silicon oxide layer over said gate stack and said extension regions;

forming sidewall structures adjacent to said carbon containing silicon oxide layer on opposite sides of said gate stack;

forming source and drain regions in said semiconductor substrate adjacent to said sidewall structures; and annealing said extension and source and drain regions.

2. The method of claim 1 wherein said carbon containing silicon oxide layer is formed using a chemical vapor deposition process comprising silane, alkylsilane, and nitrous oxide.

3. The method of claim 2 wherein said sidewall structures comprise alternating layers of silicon nitride and silicon oxide.

4. The method of claim 1 wherein said carbon containing silicon oxide layer is formed using a chemical vapor deposition process comprising disilane, alkylsilane, and nitrous oxide.

5. The method of claim 1 further comprising forming offset spacer structures adjacent to said gate stack.

6. A method for fabricating an integrated circuit transistor, comprising:

providing a semiconductor substrate;

forming a gate stack on said semiconductor substrate;

forming a first silicon oxide layer on said gate stack;

forming extension regions in said semiconductor substrate adjacent to said gate stack;

forming a carbon containing silicon oxide layer on said gate stack and said extension regions;

forming a carbon containing silicon nitride layer on said carbon containing silicon oxide layer;

forming a silicon oxide layer on said carbon containing silicon nitride layer;

etching said silicon oxide layer and said carbon containing silicon nitride layer to form sidewall structures adjacent to said carbon containing silicon oxide layer and on opposite sides of said gate stack;

forming source and drain regions in said semiconductor substrate adjacent to said sidewall structures; and annealing said extension regions and said source and drain regions.

7. The method of claim 6 wherein said carbon containing silicon oxide layer is formed using a chemical vapor deposition process comprising silane, alkylsilane, and nitrous oxide.

8. The method of claim 7 wherein said carbon containing silicon nitride layer is formed using a chemical vapor deposition process comprising silane, alkylsilane, and ammonia.

9. A method for fabricating a MOS transistor, comprising:

providing a semiconductor substrate;

forming a gate stack on said semiconductor substrate;

forming extension regions in said semiconductor substrate adjacent to said gate stack;

forming a silicon oxide layer over said gate stack and said extension regions;

forming a carbon containing silicon nitride layer over said silicon oxide layer;

etching said silicon nitride layer to form sidewall structures;

forming source and drain regions in said semiconductor substrate adjacent to said sidewall structures; and annealing said extension and source and drain regions.

10. The method of claim 9 wherein said carbon containing silicon nitride layer is formed using a chemical vapor deposition process comprising silane, alkylsilane, and ammonia.

* * * * *